United States Patent
Kitamura

(10) Patent No.: US 12,068,420 B2
(45) Date of Patent: Aug. 20, 2024

(54) WIRING BOARD, ELECTRONIC COMPONENT PACKAGE, AND ELECTRONIC APPARATUS

(71) Applicant: KYOCERA Corporation, Kyoto (JP)

(72) Inventor: Toshihiko Kitamura, Omihachiman (JP)

(73) Assignee: KYOCERA Corporation, Kyoto (JP)

( * ) Notice: Subject to any disclaimer, the term of this patent is extended or adjusted under 35 U.S.C. 154(b) by 421 days.

(21) Appl. No.: 17/436,111

(22) PCT Filed: Mar. 9, 2020

(86) PCT No.: PCT/JP2020/010108
§ 371 (c)(1),
(2) Date: Sep. 3, 2021

(87) PCT Pub. No.: WO2020/179937
PCT Pub. Date: Sep. 10, 2020

(65) Prior Publication Data
US 2022/0165889 A1 May 26, 2022

(30) Foreign Application Priority Data
Mar. 7, 2019 (JP) .................. 2019-042056

(51) Int. Cl.
*H01L 31/02* (2006.01)
*H01L 31/0203* (2014.01)
*H01S 5/02315* (2021.01)

(52) U.S. Cl.
CPC .... *H01L 31/02005* (2013.01); *H01L 31/0203* (2013.01); *H01S 5/02315* (2021.01)

(58) Field of Classification Search
CPC .......... H01L 31/02005; H01L 31/0203; H01L 23/02; H01L 23/12; H01L 23/14; H01L 23/04; H01L 23/047; H01L 23/055; H01S 5/02315; H05K 1/0219; H05K 1/0284; H05K 1/117; H05K 2201/017; H05K 2201/09172; H05K 2201/1034;
(Continued)

(56) References Cited

U.S. PATENT DOCUMENTS 9,107,316 B2 * 8/2015 Cok .................. H05K 1/117
10,791,632 B1 * 9/2020 Patterson ............ H05K 3/3405
(Continued)

FOREIGN PATENT DOCUMENTS

| CN | 103428989 A | 12/2013 |
|---|---|---|
| WO | 2014/192687 A1 | 12/2014 |

*Primary Examiner* — Kyoung Lee
*Assistant Examiner* — Christina A Sylvia
(74) *Attorney, Agent, or Firm* — Volpe Koenig

(57) ABSTRACT

A dielectric substrate has a first surface including a first terminal connector and a second terminal connector located along a first side surface. A recess is between the first terminal connector and the second terminal connector. The recess has a first inner surface continuous with the first terminal connector, a second inner surface continuous with the second terminal connector, and a bottom surface between the first inner surface and the second inner surface. The first terminal connector has first wettability with a bond on its surface, and a first region has second wettability with the bond on its surface lower than the first wettability.

13 Claims, 10 Drawing Sheets

(58) Field of Classification Search
CPC .......... H05K 2201/09845; H05K 2201/09909; H05K 5/02; H05K 5/00
See application file for complete search history.

(56) References Cited

U.S. PATENT DOCUMENTS

2013/0314887 A1  11/2013  Jung et al.
2014/0177179 A1*  6/2014  Iiyama ................. H05K 3/3442
                                                                174/250

* cited by examiner

WIRING BOARD, ELECTRONIC COMPONENT PACKAGE, AND ELECTRONIC APPARATUS

FIELD

The present disclosure relates to a wiring board, an electronic component package, and an electronic apparatus.

BACKGROUND

A known technique is described in, for example, Patent Literature 1.

CITATION LIST

Patent Literature

Patent Literature 1: WO 2014/192687

BRIEF SUMMARY

A wiring board according to an aspect of the present disclosure includes a dielectric substrate having a first surface, a second surface opposite to the first surface, a first side surface continuous with the first surface and the second surface, and a recess being open in the first surface and the first side surface. The first surface includes a first connector and a second connector located along the first side surface. The recess is between the first connector and the second connector, and has a first inner surface continuous with the first connector, a second inner surface continuous with the second connector, and a bottom surface between the first inner surface and the second inner surface. The first inner surface includes a first region and a second region closer to the bottom surface than the first region. The first connector has first wettability with a bond, and the first region has second wettability with the bond lower than the first wettability.

An electronic component package according to another aspect of the present disclosure includes a substrate, and the wiring board according to the above aspect bonded to the substrate.

An electronic apparatus according to still another aspect of the present disclosure includes the electronic component package according to the above aspect, and an electronic component mounted on the substrate and electrically connected to the wiring board.

BRIEF DESCRIPTION OF DRAWINGS

The objects, features, and advantages of the present disclosure will become more apparent from the following detailed description and the drawings.

DETAILED DESCRIPTION

Figure 1:
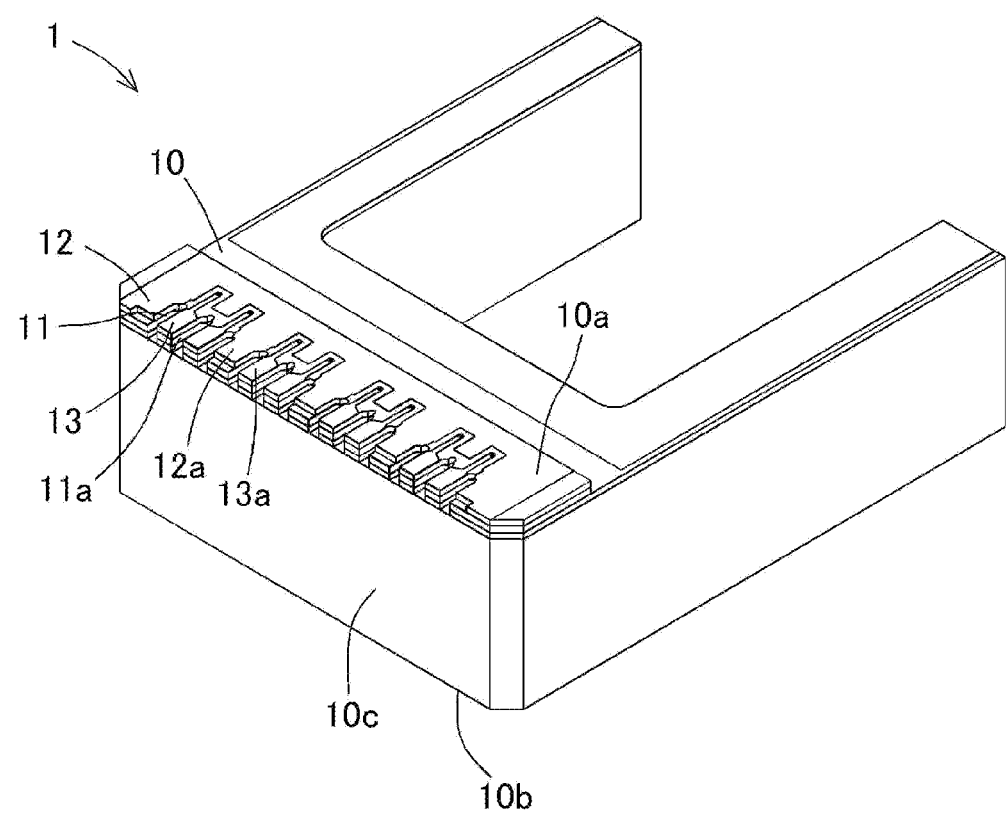
FIG. 1 is a perspective view of a wiring board according to a first embodiment.
Figure 2:
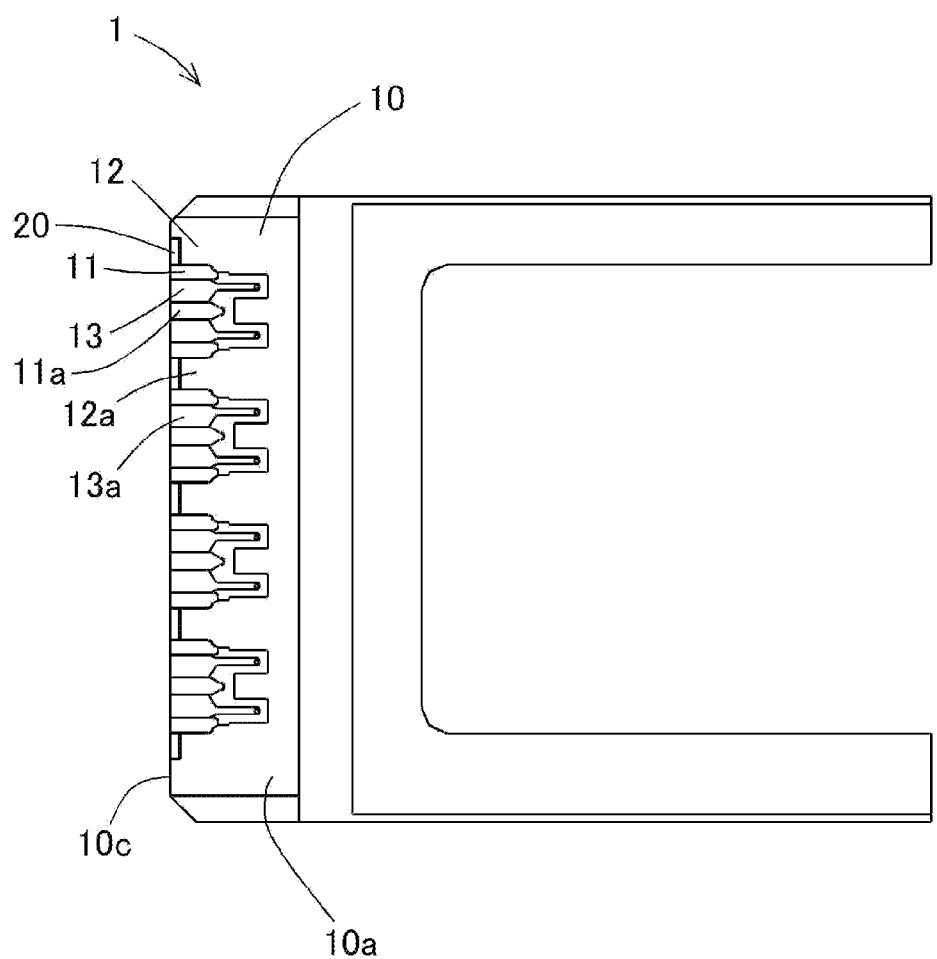
FIG. 2 is a plan view of the wiring board according to the first embodiment.
Figure 3:
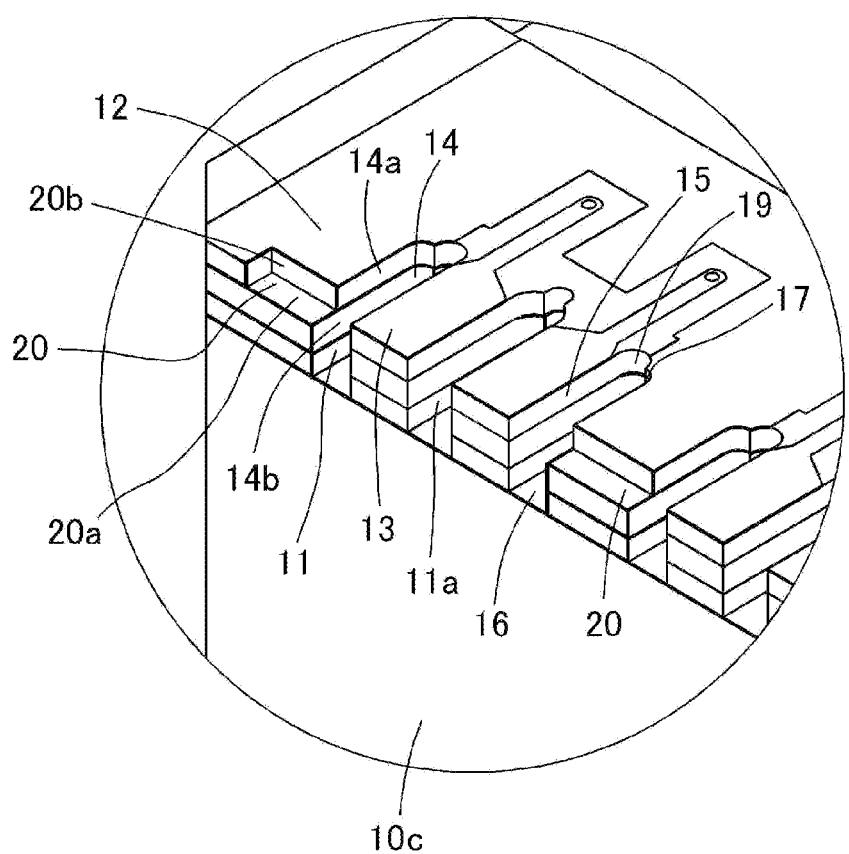
FIG. 3 is an enlarged partial view of the wiring board according to the first embodiment.

As electronic apparatuses such as mobile phones have been widespread, such apparatuses including a structure that forms the basis of a wiring board according to one or more embodiments of the present disclosure may produce electric signals with higher frequencies to transmit larger volumes of information at higher speeds. To improve their frequency response at high frequencies, a known input-output terminal (wiring board) includes lead terminals and ground terminals with recesses in between.

The lead terminals and the ground terminals are bonded to the wiring board with a bond such as a brazing material. A bond molten for terminal bonding may flow into the recesses and form an unintended conductor around signal wires and terminals. This may change the characteristic impedance of the signal wires and the terminals and degrade the frequency response for high-frequency signals.

A wiring board, an electronic component package, and an electronic apparatus according to one or more embodiments of the present disclosure will now be described with reference to the drawings. The same components are given the same reference numerals in the figures and may not be described.

A wiring board according to the first embodiment of the present disclosure will now be described with reference to FIGS. 1 to 4. A wiring board 1 includes a dielectric substrate 10. The dielectric substrate 10 has a first surface 10a, a second surface 10b opposite to the first surface 10a, a first side surface 10c continuous with the first surface 10a and the second surface 10b, and a recess 11 open in the first surface 10a and the first side surface 10c.

The dielectric substrate 10 may be a stack of multiple insulating layers formed from a dielectric material. The dielectric substrate 10 may be, for example, rectangular, U-shaped, or in any other shape as viewed from above. Examples of the dielectric material include ceramic materials such as sintered aluminum oxide, sintered mullite, sintered silicon carbide, sintered aluminum nitride, and sintered silicon nitride, or glass ceramic materials.

The first surface 10a includes a first terminal connector 12 as a first connector and a second terminal connector 13 as a second connector. The first terminal connector 12 and the second terminal connector 13 are located along the first side surface 10c. The first terminal connector 12 is bonded to a first lead terminal (described later) for electrical connection between them. The second terminal connector 13 is bonded to a second lead terminal (described later) for electrical connection between them. The recess 11 is between the first terminal connector 12 and the second terminal connector 13 (hereafter, the first and second terminal connectors 12 and 13). The recess 11 defines a space that electrically insulates the first and second terminal connectors 12 and 13 from each other. In the present embodiment, the first lead terminal is a ground terminal, and the second lead terminal is a signal terminal, for example.

The first surface 10a may include multiple first terminal connectors 12 and multiple second terminal connectors 13 located along the first side surface 10c. In the present embodiment, a first terminal connector 12, a second terminal connector 13, another second terminal connector 13, and another first terminal connector 12 are located in this order along the first side surface 10c. The adjacent second terminal connectors 13 may also define a recess (second recess 11a) between them, similarly to the recess 11. In the present embodiment, the two first terminal connectors 12 extend away from the first side surface 10c as viewed from above and may be connected to each other. This structure stabilizes the ground potential. The stabilized ground potential improves the frequency response for high-frequency signals.

The first terminal connector 12 may include, for example, a metal layer (hereafter, a first metal layer) 12a for electrical connection to the first lead terminal. The second terminal connector 13 may include, for example, a metal layer (hereafter, a second metal layer) 13a for electrical connection to the second lead terminal. The first metal layer 12a and the second metal layer 13a may be metallization layers formed on the first surface 10a of the dielectric substrate 10. The metallization layers are formed from, for example, a metal material such as tungsten, molybdenum, or manganese, and may be plated with nickel or gold.

The dielectric substrate 10 may include, for example, a wiring conductor and a conductor layer between the insulating layers. For example, the dielectric substrate 10 may include multiple wiring conductors and multiple conductor layers located around the recess 11 and at the first metal layer 12a and the second metal layer 13a as viewed from above. The wiring conductors and conductor layers may be electrically connected to one another with, for example, feedthrough conductors. The wiring conductors and conductor layers include multiple ground wiring conductors and multiple ground conductor layers that are electrically connected to one another and to the first metal layer 12a. The wiring conductors and conductor layers include multiple signal wiring conductors that are electrically connected to the second metal layer 13a.

The recess 11 has a first inner surface 14 continuous with the first terminal connector 12, a second inner surface 15 continuous with the second terminal connector 13, and a bottom surface 16 adjacent to the second surface 10b. The recess 11 also has a third inner surface 17 continuous with the first inner surface 14 and with the second inner surface 15. Although the recess 11 may have any shape, the recess 11 in the present embodiment is rectangular and has the first inner surface 14 and the second inner surface 15 parallel to each other and perpendicular to the first surface 10a. The recess 11 may be, for example, tapered or flared to have the first inner surface 14 and the second inner surface 15 that are not parallel to each other.

The recess 11 has the first inner surface 14 including a first region 14a adjacent to the first surface 10a and a second region 14b adjacent to the bottom surface 16. In the present embodiment, the first inner surface 14 includes the first region 14a and the second region 14b, and the first region 14a is continuous with the first terminal connector 12, for example. The first region 14a is continuous with the second region 14b. The second region 14b is continuous with the bottom surface 16.

In the dielectric substrate 10 in the present embodiment, the first terminal connector 12 has first wettability with the bond on its surface, and the first region 14a has, on its surface, second wettability with the bond lower than the first wettability. The bond used in the present embodiment is, for example, a silver-copper brazing material mainly containing silver and copper, or a low-melting-point bond (solder) containing silver, copper, and tin.

As defined by JIS Z3001-3:2008, wettability refers to the degree of wetting of a molten brazing material, solder, or flux adhering to and spreading on the base surface. The first terminal connector 12 has first wettability with the bond, which is the degree of wetting of the molten liquid bond adhering to and spreading on the surface of the first terminal connector 12. The first region 14a has second wettability with the bond, which is the degree of wetting of the molten liquid bond adhering to and spreading on the surface of the first region 14a. A bond with a melting point of 450° C. or higher is a brazing material. A bond with a melting point of lower than 450° C. is solder. The wettability with a brazing material may be measured with a method conforming to the wetting test method defined by JIS Z3191:2003 using, for example, a commercially available high-temperature wettability tester. The wettability with solder may be measured with a method conforming to solderability defined by JIS C60068-2-83:2014 using, for example, a commercially available solderability tester.

The first lead terminal may be bonded to the first terminal connector 12 by melting the bond on the first terminal connector 12, placing the first lead terminal on the molten bond, and then cooling and solidifying the molten bond. The first inner surface 14 may have the first region 14a having wettability with the bond lower than the first terminal connector 12. In this case, the molten bond may flow but stop at the boundary between the first terminal connector 12 and the first region 14a where the wettability changes. This reduces the bond flowing beyond the boundary into the first region 14a. This reduces an unintended conductor (bond) formed in the recess 11, reducing changes in the characteristic impedance of the lead terminals and the signal wiring conductors in the wiring board 1 and improving the frequency response for high-frequency signals.

In the present embodiment, the first terminal connector 12 has surface wettability being the wettability of the surface of the first metal layer 12a. The first region 14a has surface wettability being the wettability of the exposed surface of the dielectric material (e.g., ceramic material) of the dielectric substrate 10. The first region 14a may have lower surface wettability lower than the first terminal connector 12 and may not have the dielectric material exposed on the surface of the first region 14a. For example, the first region 14a may have a metal layer or a layer of another material, which may have lower surface wettability than the first terminal connector 12. The surfaces with unknown wettability measurement values can produce the effects described above under the conditions specified below, for example. More specifically, the surface of the first terminal connector 12 being the surface of the first metal layer 12a and the surface of the first region 14a being the exposed surface of the dielectric material of the dielectric substrate 10 can satisfy the above relationship of wettability resulting from the different materials in these surfaces. This structure can thus reduce the molten bond flowing into the first region 14a.

The dielectric substrate 10 may further include a ground conductor layer 18 covering the second region 14b in the first inner surface 14. The ground conductor layer 18 may be, for example, a metallization layer formed on the second region 14b. The metallization layer is formed from, for example, a metal material such as tungsten, molybdenum, or manganese, and may be plated with nickel or gold.

The second region 14b is covered with the ground conductor layer 18. Thus, the second region 14b has the surface to be the surface of the ground conductor layer 18. In this structure, the ground conductor layer 18 has third wettability with the bond on its surface, and the first region 14a has, on its surface, the second wettability with the bond lower than the third wettability. The ground conductor layer 18 is electrically connected to, for example, the ground wiring conductors or the ground conductor layers in the dielectric substrate 10 to further stabilize the ground potential.

Figure 4:
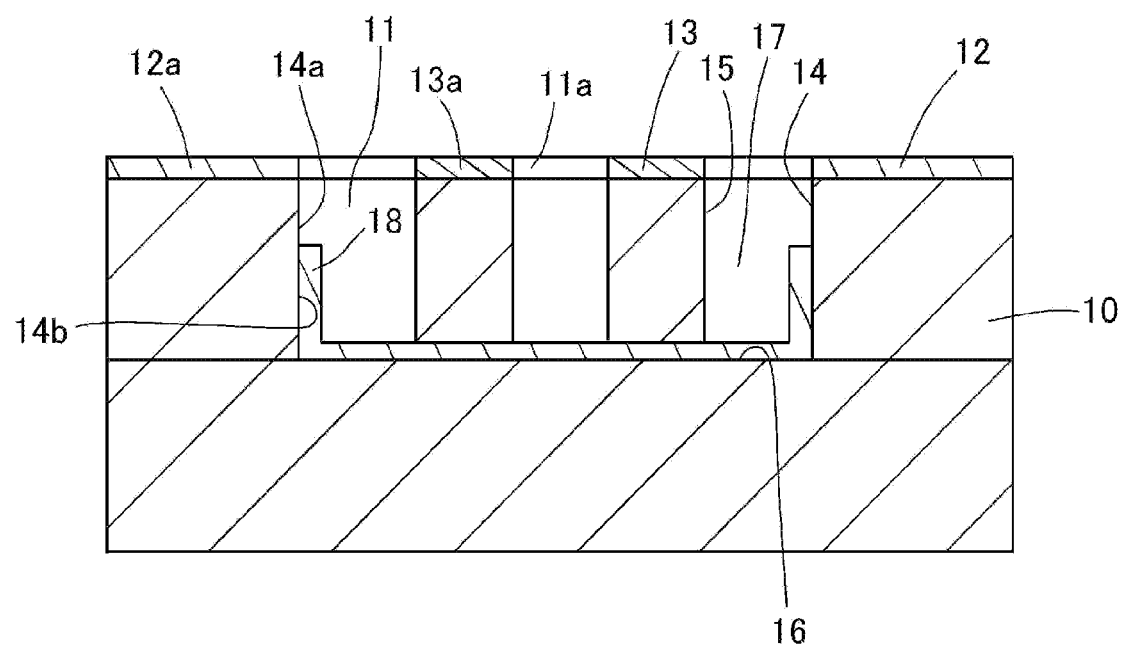
FIG. 4 is a cross-sectional view of the wiring board according to the first embodiment.

In the present embodiment, as shown in FIG. 4, the ground conductor layer 18 covers the second region 14b, and also covers the bottom surface 16 and the bottom surface of the second recess 11a between the adjacent second terminal connectors 13. In the present embodiment, the first terminal connector 12, the two second terminal connectors 13, and the first terminal connector 12 are aligned in series, as described above. Thus, the recess 11 described above, the second recess, and another recess (the other recess 11) are aligned in series between the terminal connectors. The ground conductor layer 18 may extend to the other recess 11 and cover the bottom surface 16 and the second region 14b of the other recess 11.

In the recess 11, the third inner surface 17 may have a groove 19 extending in the thickness direction of the dielectric substrate 10. The thickness direction is the direction connecting the first surface 10a and the second surface 10b, or more specifically, the direction perpendicular to the first surface 10a and the second surface 10b. The groove 19 is, for example, semicircular as viewed from above. The groove 19 may also be rectangular or semi-elliptical, for example. The groove 19 has an inner surface having the dielectric material of the dielectric substrate 10 exposed. The groove 19 reduces the dielectric constant between the first terminal connector 12 and the second terminal connector 13. The lower dielectric constant allows, for example, the first terminal connector 12 and the second terminal connector 13 to be located with a shorter distance between them without changing the characteristic impedance, thus allowing the wiring board 1 to be either smaller or to include denser terminals (or more pins).

In the present embodiment, the groove 19 has the inner surface continuous with the first inner surface 14 with the third inner surface 17 in between, and is directly continuous with the second inner surface 15. This structure facilitates manufacture of the recess 11 having a metal layer on an intended surface.

In the present embodiment, the first terminal connector 12 may include a step 20 defined by a portion adjacent to the first side surface 10c and located closer to the second surface 10b. For example, the first terminal connector 12 includes a rectangular portion 20a continuous with the first side surface 10c and one step (equivalent to, for example, a single insulating layer) closer to the second surface 10b than the other portion. The first metal layer 12a may be located on the step 20. More specifically, the step 20 may include the rectangular portion 20a and a wall surface 20b between the rectangular portion 20a and the other portion. The first metal layer 12a may be located on the wall surface 20b. The wall surface 20b increases the area of the first terminal connector 12, or more specifically the first metal layer 12a, for the first terminal connector 12 with the step 20 than for the first terminal connector 12 without the step 20. The step 20 thus further stabilizes the ground potential.

The step 20 is rectangular in the present embodiment, but may be polygonal or semicircular. The step having such a shape increases the area of the first terminal connector 12 by its wall surface and thus further stabilizes the ground potential.

Figure 5:
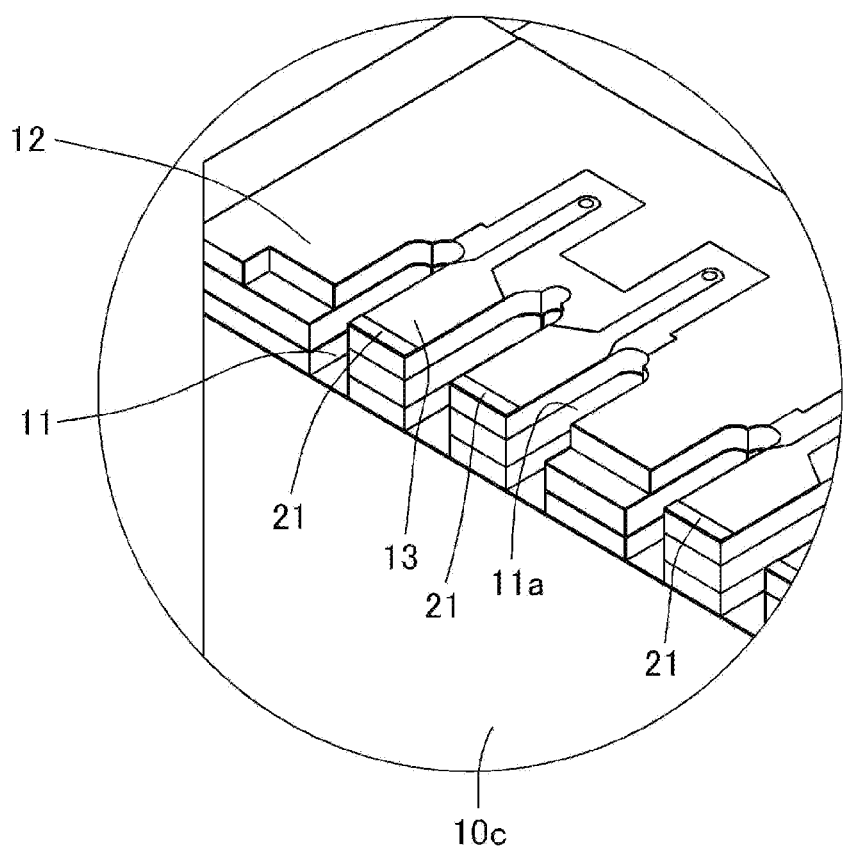
FIG. 5 is an enlarged partial view of a wiring board according to a second embodiment.

A second embodiment of the present disclosure will now be described with reference to FIG. 5. In the present embodiment, the second terminal connector 13 further includes a coating layer 21 adjacent to the first side surface 10c.

The second lead terminal may be bonded to the second terminal connector 13 by melting the bond on the second terminal connector 13, placing the second lead terminal on the molten bond, and then cooling and solidifying the molten bond. The molten bond is stopped at the boundary between the second metal layer 13a and the coating layer 21, thus causing the molten bond to spread less on the second terminal connector 13. The molten bond with less spreading forms a moderate fillet of bond, thus increasing the bond strength for the second lead terminal.

The coating layer 21 may be formed from any material that can stop the molten bond. Similarly to the dielectric material of the dielectric substrate 10, the coating layer 21 may be formed from, for example, ceramic materials such as sintered aluminum oxide, sintered mullite, sintered silicon carbide, sintered aluminum nitride, and sintered silicon nitride, or glass ceramic materials. In this case, the second terminal connector 13 includes, for example, the second metal layer 13a as described above. The coating layer 21 has lower wettability with the bond on its surface than the second metal layer 13a. The wettability difference causes the molten bond to be stopped at the boundary between the second metal layer 13a and the coating layer 21. The dielectric substrate 10 and the coating layer 21 may be formed from the same dielectric material or from different dielectric materials. The coating layer 21 may be formed from a material other than a dielectric material, including a metal material. In this a case, the coating layer 21 may have at least a predetermined thickness to define a step to stop the molten bond, with the second metal layer 13a and the coating layer 21 having any wettability. More specifically, the second metal layer 13a may have the surface closer to the second surface 10b than the surface of the coating layer 21. The second terminal connector 13 thus has a step on its surface to stop the molten bond.

In the present embodiment, the coating layer 21 extends across the entire edge. In other words, the coating layer 21 extends across the entire length of the edge along the first side surface 10c. In some embodiments, the coating layer 21 may extend partially on the edge to stop the molten bond. For example, the coating layer 21 may be located at the center of the edge alone, or at both ends of the edge alone without being at the center.

Figure 6:
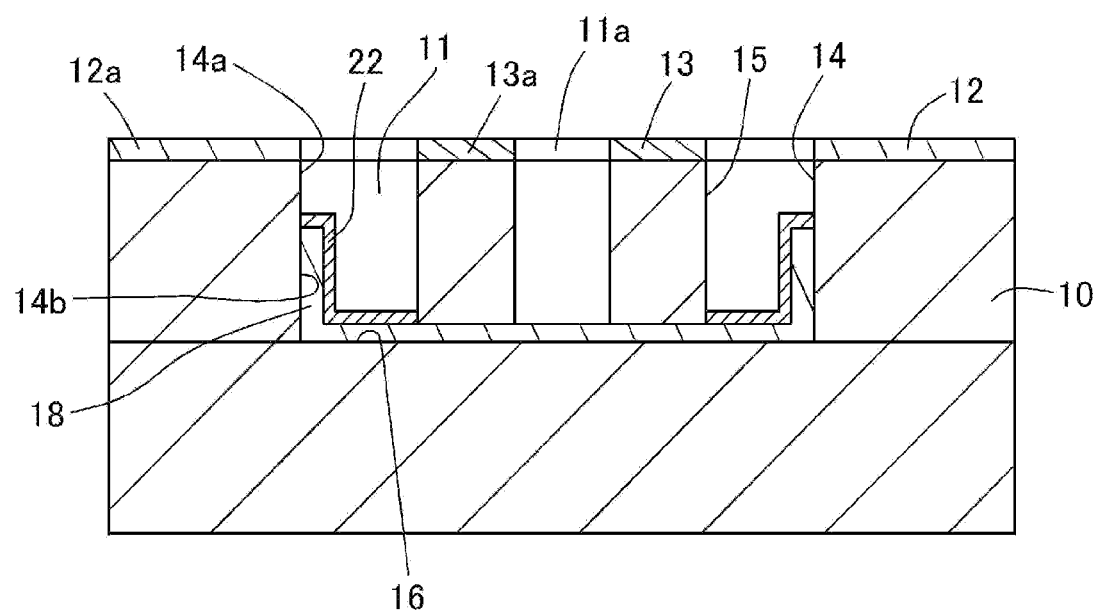
FIG. 6 is a cross-sectional view of a wiring board according to a third embodiment.

A third embodiment of the present disclosure will now be described with reference to FIG. 6. In the present embodiment, the dielectric substrate 10 further includes a dielectric material layer 22 on the ground conductor layer 18. The dielectric material layer 22 may be located at least on the surface of the ground conductor layer 18 on the second region 14b. Similarly to the dielectric material of the dielectric substrate 10, the dielectric material layer 22 may be formed from, for example, ceramic materials such as sintered aluminum oxide, sintered mullite, sintered silicon carbide, sintered aluminum nitride, and sintered silicon nitride, or glass ceramic materials.

In the present embodiment, the dielectric material layer 22 extends to the bottom surface 16 of the recess 11 and covers the ground conductor layer 18. The dielectric material layer 22 covers the entire ground conductor layer 18 without exposure of the ground conductor layer 18 in the recess 11. The dielectric material layer 22 is not located in the second recess 11a described above.

Figure 7:
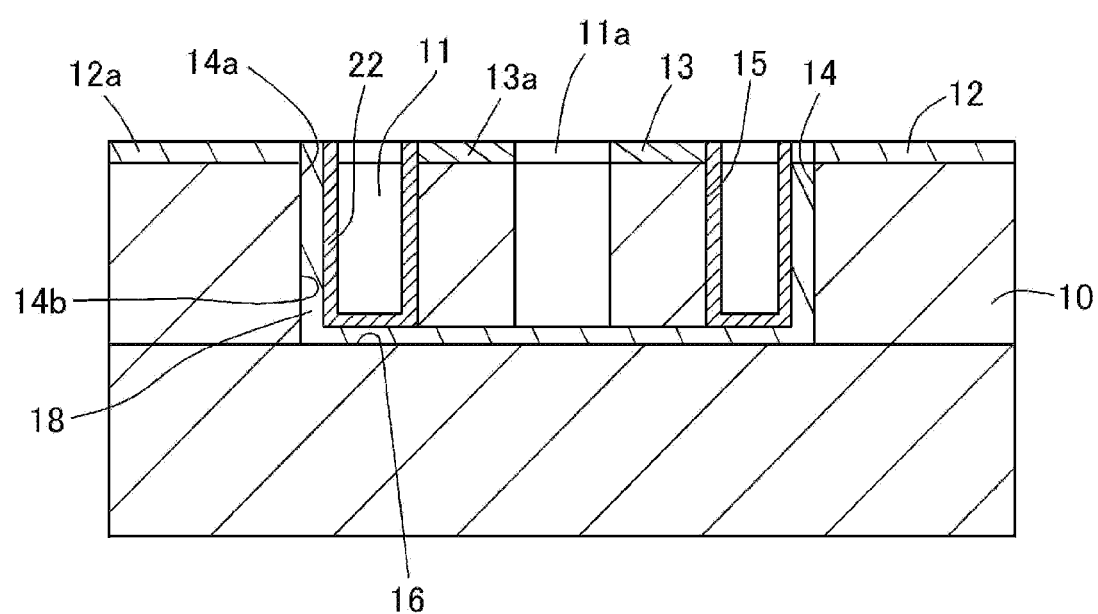
FIG. 7 is a cross-sectional view of a wiring board according to a fourth embodiment.

A fourth embodiment of the present disclosure will now be described with reference to FIG. 7. The present embodiment differs from the third embodiment in the positions of the ground conductor layer 18 and the dielectric material layer 22. More specifically, the ground conductor layer 18 in the present embodiment covers the entire first inner surface 14, or more specifically, the first region 14a and the second region 14b, and also covers the bottom surface 16. The ground conductor layer 18 also covers the bottom surface of the second recess 11a between the second terminal connectors 13. The ground conductor layer 18 further extends to the opposite recess 11 (the other recess 11 described above) to cover the bottom surface 16 and the entire first inner surface 14 of the opposite recess 11. The ground conductor layer 18 is continuous with and electrically connected to the first metal layer 12a in the first terminal connector 12, thus further stabilizing the ground potential.

The dielectric material layer 22 covers the entire ground conductor layer 18 without exposure of the ground conductor layer 18 in the recess 11. The dielectric material layer 22 is located also on the second inner surface 15. In other words, the dielectric material layer 22 is located at least on the first inner surface 14, the second inner surface 15, and the bottom surface 16 of the recess 11. The dielectric material layer 22 may be located on the third inner surface 17, and may be located on the entire inner surface of the recess 11.

In the present embodiment, the first terminal connector 12 has surface wettability being the first wettability of the surface of the first metal layer 12a. The first region 14a has surface wettability being the second wettability of the surface of the dielectric material layer 22 located on the ground conductor layer 18 on the first region 14a. The dielectric material layer 22 is formed from a material similar to the dielectric material of the dielectric substrate 10 as described above. Thus, the dielectric material layer 22 has, on its surface, the second wettability similar to the wettability of the exposed surface of the dielectric material of the dielectric substrate 10.

Figure 8:
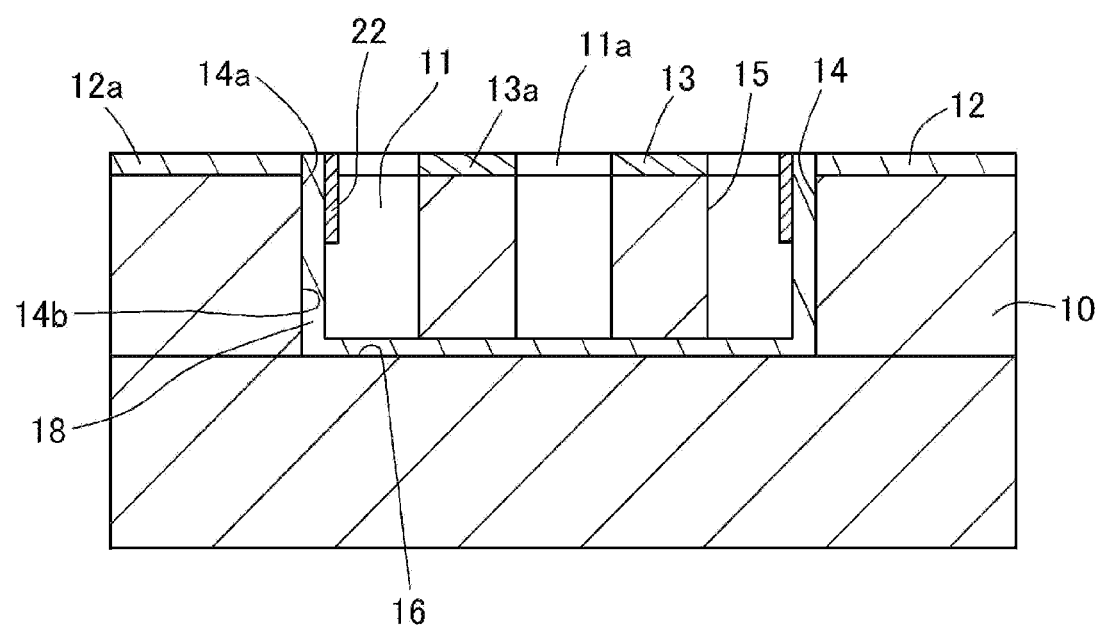
FIG. 8 is a cross-sectional view of a wiring board according to a fifth embodiment.

A fifth embodiment of the present disclosure will now be described with reference to FIG. 8. The present embodiment differs from the fourth embodiment in the position of the dielectric material layer 22. The ground conductor layer 18 is located similarly to that in the fourth embodiment and thus further stabilizes the ground potential.

The dielectric material layer 22 covers a portion of the ground conductor layer 18 located on the first region 14a in the first inner surface 14 in the recess 11. In the present embodiment, the first terminal connector 12 has surface wettability being the first wettability of the surface of the first metal layer 12a. The first region 14a has surface wettability being the second wettability of the surface of the dielectric material layer 22 located on the ground conductor layer 18 on the first region 14a. The dielectric material layer 22 is formed from a material similar to the dielectric material of the dielectric substrate 10 as described above. Thus, the dielectric material layer 22 has, on its surface, the second wettability similar to the wettability of the exposed surface of the dielectric material of the dielectric substrate 10.

Figure 9:
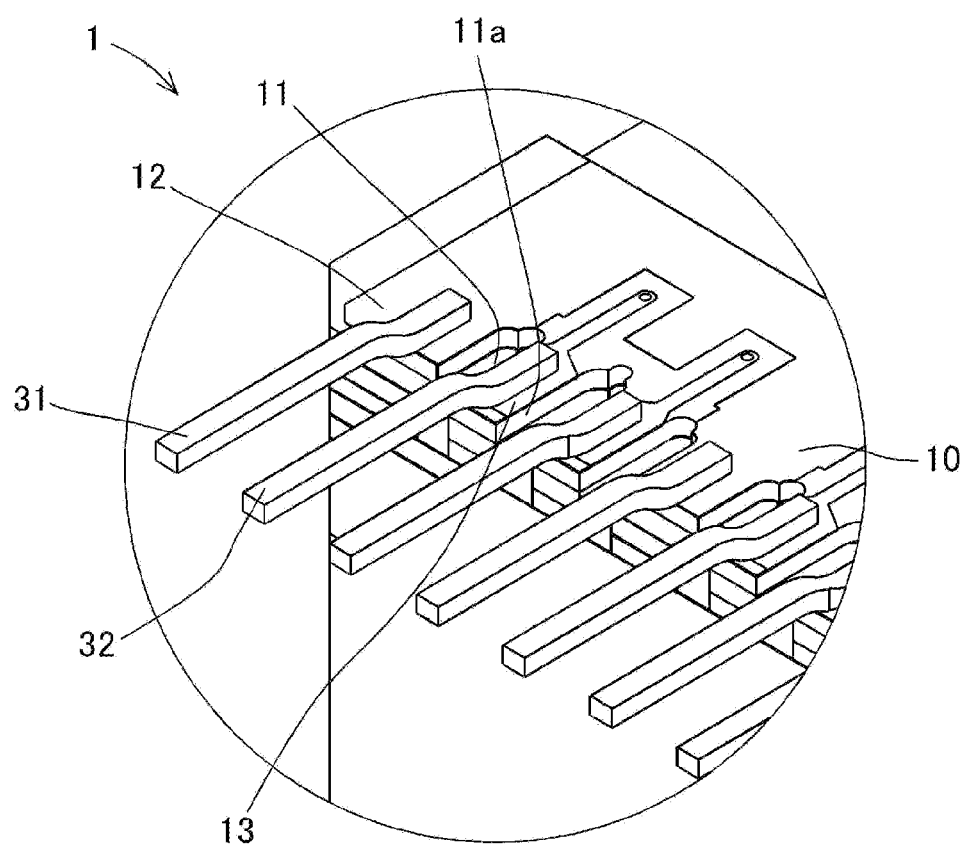
FIG. 9 is an enlarged partial view of a wiring board according to a sixth embodiment.

A sixth embodiment of the present disclosure will now be described with reference to FIG. 9. In the present embodiment, the wiring board 1 includes the dielectric substrate 10 described above, and also includes a first lead terminal 31 bonded to the first terminal connector 12 with a bond, and a second lead terminal 32 bonded to the second terminal connector 13 with a bond. The first lead terminal 31 is a ground terminal, and the second lead terminal 32 is a signal terminal, as described above. The first lead terminal 31 and the second lead terminal 32 are also connected to, for example, an external mounting board. The bond may flow into the recess 11 and form an unintended conductor that may change the characteristic impedance or other parameters of the second lead terminal 32 for transmitting high-frequency signals. The structure in the present embodiment reduces the bond flowing into the recess 11 as described above and reduces changes in characteristic impedance, thus improving the high-frequency response.

An example method for manufacturing the wiring board 1 will now be described. The dielectric substrate 10 including multiple insulating layers formed from, for example, sintered aluminum oxide may be prepared in the manner described below. An aluminum oxide-containing powdery raw material and a silicon oxide-containing powdery raw material are mixed with, for example, an appropriate organic binder and an appropriate solvent to form slurry. The slurry is then shaped into sheets using, for example, the doctor blade method, to yield multiple ceramic green sheets. The ceramic green sheets have a cutout to be the recess 11.

The ceramic green sheets are then stacked on one another and pressure-bonded. The stacked ceramic green sheets are then fired in a reducing atmosphere, and cut or punched into an appropriate shape to complete the dielectric substrate 10 with an intended shape.

The first metal layer 12a, the second metal layer 13a, the ground conductors, and the signal conductors are formed from, for example, a metallization layer that may be formed from a metal having a high melting point, such as tungsten, molybdenum, or manganese, prepared in the manner described below. A high-melting-point metal powder is kneaded with an organic solvent and a binder to prepare a metal paste. The metal paste is then printed on a predetermined portion of the ceramic green sheet to be the upper or lower surface of the insulating layer by, for example, screen printing. These ceramic green sheets with a printed metal paste are stacked on one another, pressure-bonded, and then co-fired. Through the above process, the metallization layer is deposited on the upper surface and the inner layer of the dielectric substrate 10 as the first metal layer 12a, the second metal layer 13a, the ground conductors, and the signal conductors. In this process, no metallization layer is formed on the first region 14a in the first inner surface 14 in the recess 11. The first metal layer 12a, the second metal layer 13a, and the conductor layers may be plated with nickel or gold.

The feedthrough conductors may be formed in the manner described below. Through-holes are formed in the ceramic green sheets to be multiple insulating layers. The through-holes are filled with the same metal paste as for the conductor layers. The ceramic green sheets are then stacked on one another, pressure-bonded, and then co-fired. The through-holes can be formed by, for example, die machining using a metal pin, or punching, for example, with laser. The metal paste filling the through-holes may be facilitated with, for example, vacuum suction.

Figure 10:
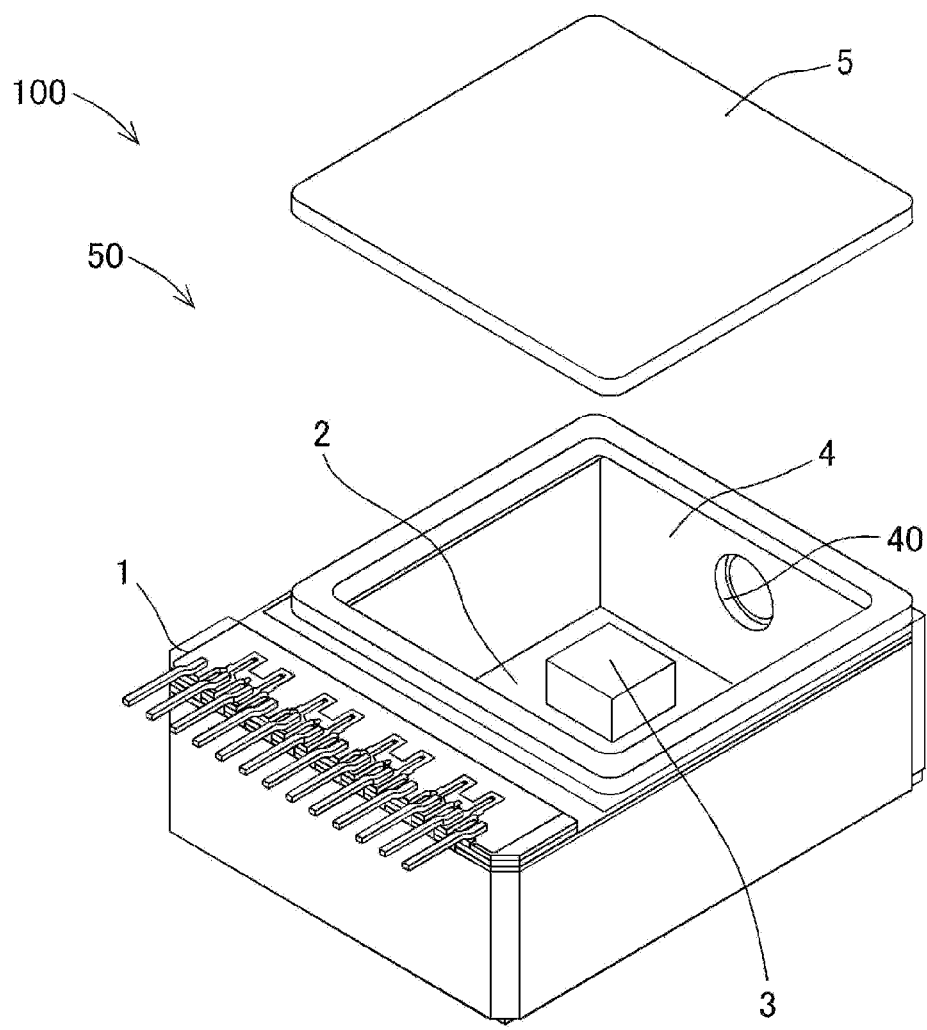
FIG. 10 is a perspective view of an electronic component package and an electronic apparatus according to another embodiment of the present disclosure.

An electronic component package and an electronic apparatus according to another embodiment of the present disclosure will now be described with reference to FIG. 10. An electronic component package 50 includes a substrate 2 and the wiring board 1 bonded to the substrate 2. In the present embodiment, the wiring board 1 is U-shaped and is attached to a sidewall 4 to form a frame, which is then bonded to the surface of the substrate 2. The substrate 2 and the sidewall 4 may be formed from, for example, a metal such as iron, copper, nickel, chromium, cobalt, molybdenum or tungsten, or an alloy of these metals, such as a copper-tungsten alloy, a copper-molybdenum alloy, or an iron-nickel-cobalt alloy. The metal member for the substrate 2 and the sidewall 4 may be prepared by processing (e.g., rolling or punching) an ingot formed from such a metal material.

An electronic apparatus 100 includes the electronic component package 50, an electronic component 3, and a lid 5. The electronic component 3 is mounted on the substrate 2 and electrically connected to the wiring board 1.

The electronic component 3 may be, for example, an optical semiconductor device such as a laser diode (LD) or a photodiode (PD). For an LD, the sidewall 4 may have a through-hole 40 to receive an optical fiber. The lid 5 is bonded to the upper edges of the wiring board 1, which is a frame, and the sidewall 4 to cover the electronic component package 50. The lid 5 may be formed from, for example, a metal such as iron, copper, nickel, chromium, cobalt, molybdenum or tungsten, or an alloy of these metals, such as a copper-tungsten alloy, a copper-molybdenum alloy, or an iron-nickel-cobalt alloy. The metal member for the lid 5 may be prepared by processing (e.g., rolling or punching) an ingot formed from such a metal material.

The electronic component 3 is mounted inside the electronic component package 50, and is electrically connected to the wiring board 1 with, for example, bonding wires. The electronic component 3 is then sealed with the lid 5.

The electronic component package 50 and the electronic apparatus 100 according to the present embodiment include the above-described wiring board 1 having an improved frequency response, and thus effectively transmit high-frequency signals.

The present disclosure is not limited to the above embodiments, and the embodiments may be combined and changed variously without departing from the spirit and scope of the present disclosure. For example, the step 20 in the first embodiment may be included in the other embodiments. The coating layer 21 in the second embodiment may be included in the other embodiments. The electronic component package 50 and the electronic apparatus 100 may include the wiring board 1 according to any of the above embodiments or a wiring board 1 combining any features in the above embodiments.

The first region 14a in the above embodiments is continuous with the first terminal connector 12. However, this structure may be modified. In some embodiments, the first terminal connector 12 may include a feature corresponding to the coating layer 21 at the edge adjacent to the first inner surface 14. In some embodiments, the first region 14a may include a feature corresponding to the ground conductor layer 18 at the edge adjacent to the first terminal connector 12.

In the first inner surface 14 of the recess 11 in the above embodiments, the first region 14a is continuous with the second region 14b, but the first region 14a may not be continuous with the second region 14b. In some embodiments, another region may be between the first region 14a and the second region 14b. Any modification in the claims fall within the scope of the present disclosure.

REFERENCE SIGNS LIST 1 wiring board
2 substrate
3 electronic component
4 sidewall
5 lid
10 dielectric substrate
10a first surface
10b second surface
10c first side surface
11 recess
11a second recess
12 first terminal connector
12a first metal layer
13 second terminal connector
13a second metal layer
14 first inner surface
14a first region
14b second region
15 second inner surface
16 bottom surface
17 third inner surface
18 ground conductor layer
19 groove
20 step
20a rectangular portion
20b wall surface
21 coating layer
22 dielectric material layer
31 first lead terminal
32 second lead terminal
40 through-hole
50 electronic component package
100 electronic apparatus

The invention claimed is:

1. A wiring board, comprising:
a dielectric substrate having
a first surface,
a second surface opposite to the first surface,
a first side surface continuous with the first surface and the second surface, and
a recess being open in the first surface and the first side surface,
wherein the first surface includes a first connector and a second connector located along the first side surface,
the recess is between the first connector and the second connector, and has a first inner surface continuous with the first connector, a second inner surface continuous with the second connector, and a bottom surface between the first inner surface and the second inner surface,
the first inner surface includes a first region and a second region closer to the bottom surface than the first region, and
the first connector has first wettability, and the first region has second wettability lower than the first wettability.

2. The wiring board according to claim 1, wherein
the first connector is continuous with the first region.

3. The wiring board according to claim 1, wherein
the second region has third wettability, and the second wettability is lower than the third wettability.

4. The wiring board according to claim 1, wherein
the first connector includes a metal layer, and
the first region includes a dielectric material included in the dielectric substrate.

5. The wiring board according to claim 1, wherein
the first connector has a first end adjacent to the first side surface, and the first end includes a step recessed toward the second surface.

6. The wiring board according to claim 1, wherein the second connector has a second end adjacent to the first side surface, and the second end is covered with a coating layer.

7. The wiring board according to claim 1, wherein the recess has a third inner surface continuous with the first inner surface and with the second inner surface, and
the third inner surface has a groove extending in a thickness direction of the dielectric substrate.

8. The wiring board according to claim 1, wherein the dielectric substrate further includes a ground conductor layer covering at least a portion of the first inner surface.

9. The wiring board according to claim 8, wherein the dielectric substrate further includes a dielectric material layer on the ground conductor layer.

10. The wiring board according to claim 1, further comprising:
a first terminal bonded to the first connector; and
a second terminal bonded to the second connector.

11. An electronic component package, comprising:
a substrate; and
the wiring board according to claim 1 bonded to the substrate.

12. An electronic apparatus, comprising:
the electronic component package according to claim 11; and
an electronic component mounted on the substrate and electrically connected to the wiring board.

13. A wiring board, comprising:
a dielectric substrate having
a first surface,
a second surface opposite to the first surface,
a first side surface continuous with the first surface and the second surface, and
a recess being open in the first surface and the first side surface,
wherein the first surface includes a first connector and a second connector located along the first side surface,
the recess is between the first connector and the second connector, and has a first inner surface continuous with the first connector, a second inner surface continuous with the second connector, and a bottom surface between the first inner surface and the second inner surface,
the first inner surface includes a first region and a second region closer to the bottom surface than the first region,
the first connector includes a metal layer, and the first connector has a surface being a surface of the metal layer, and
the first region includes a dielectric material included in the dielectric substrate.

* * * * *